United States Patent [19]

Schapiro, Jr.

[11] Patent Number: 5,603,628
[45] Date of Patent: Feb. 18, 1997

[54] COMPUTER CARD RETAINER

[76] Inventor: Peter N. Schapiro, Jr., 3156 Hudson Ave., Walnut Creek, Calif. 94596

[21] Appl. No.: 509,537

[22] Filed: Jul. 31, 1995

[51] Int. Cl.$^6$ ............................................... H01R 13/639
[52] U.S. Cl. ...................... 439/327; 439/371; 361/759; 361/801
[58] Field of Search ..................... 361/686, 732, 361/740, 747, 759, 785, 789, 801, 807, 809; 439/327, 371, 366; G06F 1/16

[56] References Cited

U.S. PATENT DOCUMENTS

| | | | |
|---|---|---|---|
| 3,152,219 | 10/1964 | Murray et al. | 174/72 |
| 4,121,880 | 10/1978 | Rollins et al. | 339/119 R |
| 4,198,024 | 4/1980 | Cavanna | 361/759 |
| 4,872,853 | 10/1989 | Webster | 439/327 |
| 4,919,619 | 4/1990 | Chompff | 439/371 |
| 5,383,793 | 1/1995 | Hsu et al. | 439/327 |

FOREIGN PATENT DOCUMENTS 0507440  6/1939  United Kingdom .................. 439/371

OTHER PUBLICATIONS

IBM Technical Disclosure Bulletin, "Snap–On Card Retention Clip", vol. 21 No. 2 pp. 440–441 Jul. 1978.

Primary Examiner—Michael W. Phillips
Assistant Examiner—Lynn D. Feild
Attorney, Agent, or Firm—Bielen, Peterson & Lampe

[57] ABSTRACT

A retainer device for computer cards that are mounted in slots on connectors fixed to the printed circuit board, the retainer device combining an anchor mounted on the connector and a tie-strap around the card that engages the connector to firmly secure the card to the connector.

12 Claims, 1 Drawing Sheet

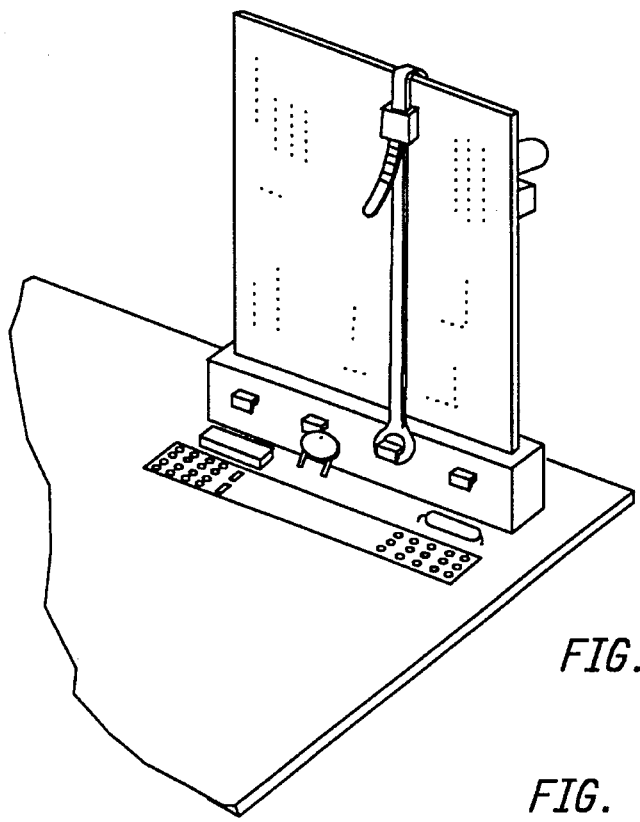
FIG. 1
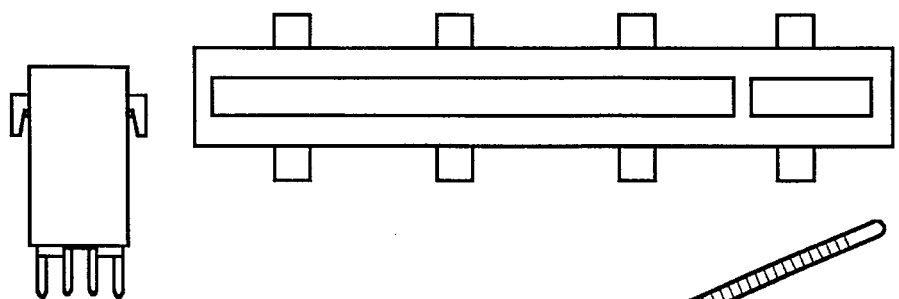
FIG. 2
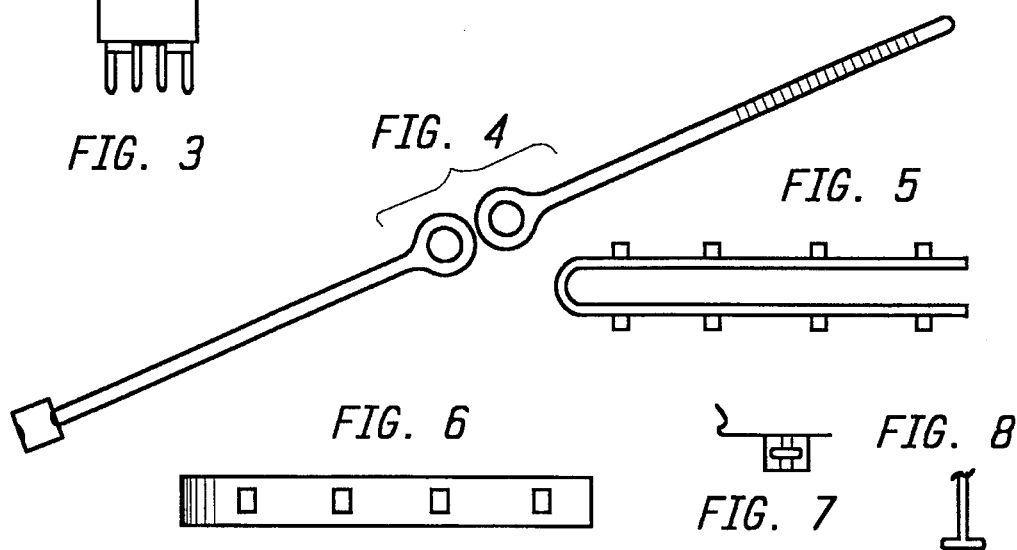
FIG. 3
FIG. 4
FIG. 5
FIG. 6
FIG. 7
FIG. 8

COMPUTER CARD RETAINER

BACKGROUND OF THE INVENTION

This invention relates to a retainer device for computer cards to maintain the cards firmly in the card slots on the printed circuit board. The retainer device comprises a hook means on each side of the card bus connector and an adjustable tie means that engages the hook means to secure the card to the connector.

This invention is particularly directed to the common computer bus slots, such as PCI, ISA, EISA and other typical, standardized bus slots, for receiving replaceable cards in the personal computer. The card retainer may also be used for any electronic device having plug-in cards where a problem of physical dislodgement of the card occurs.

Operational failure of personal computers as a result of dislodged computer cards is particularly acute in high volume personal computer sales. Frequently, the narrow margins of profit are maintained by volume shipping, directly to the customer from assembly centers. Direct mail and phone sales enable product to be placed in the user's hands with little or no personal contact with the user. During shipping and handling, or during the process of set-up, auxiliary mother board cards may become partially dislodged resulting in malfunction or a dead computer. The result is a dissatisfied customer and a service call to the seller requiring the extended personal involvement that was sought to be minimized.

Although most computers are thoroughly tested before shipment, failure in the hands of the user is simply the result of a mechanical, frictional disengagement of the card contacts with the bus contacts in bus connector providing the bus slot. This resulting loss of electrical contact causes operational failure that is often difficult to diagnose and correct remotely. Loss of revenue and loss of consumer confidence in the product makes this simple problem one of serious concern.

SUMMARY OF THE INVENTION

The retainer device of this invention enables a computer assembler or computer shipper to retain add-on computer cards firmly in their bus slots at low cost. The card retainer device utilizes a pair of tie members which connect to anchors locate on or attached to the card housing bus. Therefore, any slippage or partial dislodgement of the add-on computer card from its bus slot is eliminated.

The preferred retainer device incorporates anchor means fabricated directly into the bus connectors into which computer cards are contemplated to be installed. When select cards are then installed by the assembler, a tie means can be added to secure the installed cards. Extra tie means may be provided by the retailer or service provider to secure added cards or replaced cards.

An alternate embodiment consists of a clip device whose sides provide the necessary anchors to secure the tie members. These clips are installed onto existing bus connectors without integral hook means, allowing computer cards to be secured with no additional modifications of the bus connectors installed during manufacture.

The retainer device solves the vexing problem of card slippage during shipment or rough handling of the computer in which they are installed, resulting in malfunction of the computer. The simple, cost-effective use of the retainer device avoids costly service calls and servicing of the computer, as well as the lost use time and user frustration. These and other features will become apparent from a consideration of the Detailed Description of the Preferred Embodiments.

BRIEF DESCRIPTION OF THE DRAWINGS

FIG. 1 is a perspective view of the retainer device retaining a computer card in a bus connector.

FIG. 2 is an enlarged top view of the bus connector with anchor means.

FIG. 3 is an enlarged side view of the bus connector of FIG. 2.

FIG. 4 is a top view of the tie means for the retainer device of FIG. 1.

FIG. 5 is a top view of an anchor clip that is an alternate anchor means for the retainer device of FIG. 1.

FIG. 6 is a side view of the anchor clip of FIG. 5.

FIG. 7 is a partial top view of an alternate embodiment of an anchor means for a bus connector.

FIG. 8 is a partial side view of an alternate embodiment of a tie means for engaging the anchor means of FIG. 7.

DETAILED DESCRIPTION OF THE PREFERRED EMBODIMENTS

Referring to FIG. 1, the retainer device, designated generally by the reference numeral 10, is shown utilizing the concepts of this invention. The retainer device 10 comprises a tie means 12 and an anchor means 16. The anchor means 16 is preferably located on a typical bus connector 18 fixed to a printed circuit board 20. The retainer device 10 secures an add-on computer card 22 to the bus connector 18 on the circuit board 20.

In the preferred embodiment, as shown in FIGS. 1–4, the anchor means 16 comprises at least one pair of projecting, hooked anchors 24 that are integral with the bus connector 18 and formed during the fabrication of the molded, plastic housing 26 of the bus connector 18. The tie means 12 in this embodiment comprises a modified pull-tie strap 28.

The hooked anchors 24 shown in the top view of FIG. 2 can be placed at intervals along the outer longitudinal faces 30 of the housing bus connector 18, allowing a computer board assembler to choose one or more pairs of hooked anchors 24 on opposite sides of the bus connector 18 to be attached to the tie means 12.

Each of the hooked anchors 24 as shown in the end view of FIG. 3 is orientated with an engagement face 32 directed generally towards the printed circuit board 20 so that engagement is insured and tension in the tie means 12 connected to the hooked anchors 24 will firmly secure the add-on computer card 22 to the bus connector 18 and insure that there is an electrical connection between the computer card 22 and the us connector 18. The pin terminals (not visible) of the bus connector 18 are soldered in the pin socket holes of the circuit board and securely fixes the bus connectors to the circuit board. This insures that there is an electrical connection between the computer card 22 and the bus connector 18. The pin terminals 33 of the bus connector 18 are soldered in the pin socket holes 35 of the circuit board 20 and securely fixes the bus connectors 18 to the circuit board 20. Therefore, rough handling during shipping or other activities will not dislodge the card and break electrical contact.

As shown in FIG. 3, the pull-tie strap 28 consists of two members 32 and 34. A first member 32 is formed with a tongue end 36 and an eyelet end 38 which connects to the hooker anchor 14 with the eyelet end 40 in engagement with the engagement face 32 of the hooked anchor 14 as shown in FIG. 1. The second member 34 is formed with an eyelet end 40 and a receptacle end 44 that has a locking mechanism 46 that receives the tongue end 36 of the first member 32 and locks when the tongue end 36 is pulled though to the position the computer card 22 is firmly seated and retained in the bus connector 18.

A typical computer includes multiple bus connectors mounted in banks on the printed circuit board. In FIG. 1 a socket 48 for a second bus connector is shown. Because the circuit board may include the electrical components 50 adjacent to or between bus connectors, situations arise where an anchor element is not accessible. For example, in FIG. 1 the raised capacitor 50a on the circuit board 20 interferes with the hooked anchor 24a. By providing a series of anchor elements 16 at least one pair will be available for the tie element 12.

Although computer add-on cards have a terminal end of consistent size to fit into the bus slot 52, shown in the top view of the empty bus connector of FIG. 2, the cards may be of different height. The adjustable tie-means 12 allows the tie means 12 to be used with a variety of computer cards of different height.

As shown in FIGS. 5 and 6, an add-on adapter 54 can be utilized where the bus connector 18 is not fabricated with integral anchor means 16. The add-on adapter 54 is in the form of a plastic clip 56 with a pair of prongs 58 with a series of hooked anchors 24 along the outside of each prong 58. The plastic clip 56 has a semicircular end 60 allowing the clip 52 to be spread if necessary during gluing and slipped onto the outside of a conventional bus connector and secured thereto by an appropriate adhesive. The hooked anchors 24 have the same configuration as those previously described and engage the tie means 12 in the same manner.

As alternate embodiment, to demonstrate the scope of the invention, an inexpensive retainer device can be constructed incorporating a tie means 62 that uses a strong monofilament string 64 and an anchor means 66 that is a slotted tab 70. The tie means 62 is in the form of a pair of monofilament strings 64 (one shown in FIG. 8) anchored to the slotted tab 70 in FIG. 7 by a T-bar end 72 that is inserted through a slot 74 in the slotted tab 70. The slot 74 has a length that is shorter than the length of the T-bar end 72 and retains the T-bar end 72 in the tab 70. The opposite ends of the monofilament string are strung around the computer card and interconnected by a ratchet mechanism similar to that of the strap as is commonly used for filament ties, or simply knotted where appropriate.

Although the retainer device is primarily used for retaining computer add-on cards in complementary bus slots of bus connectors, the retainer device may be used for retaining PCMCIA cards in PCMCIA connectors and other similar applications.

While, in the foregoing, embodiments of the present invention have been set forth in considerable detail for the purposes of making a complete disclosure of the invention, it may be apparent to those of skill in the art that numerous changes may be made in such detail without departing from the spirit and principles of the invention.

What is claimed is:

1. In a computer having connectors with card slots and replaceable computer cards mountable in the card slots of the connectors;

a retainer device for securing computer cards mounted in the slots of the connectors comprising:

an anchor mounted on the connectors; and, a tie extendable around a computer card mounted in a card slot, the tie having connector ends engageable with the anchor to secure the card in the slot, wherein the connectors have opposite longitudinal sides and the anchor mounted on the connectors comprises a clip with means for fastening the clip to the connectors, the clip having prongs, the prongs being engageable with the longitudinal sides of a connector and the anchor having at least one pair of anchor hooks, each of the hooks of the pair being located on opposite longitudinal sides of the connector and engageable with one of the connector ends of the tie.

2. The retainer device of claim 1 wherein the tie has interconnector ends opposite the connector ends engageable with the anchor, the retainer further comprising:

interconnector means for interconnecting the interconnector ends when the interconnector ends are interconnected for securing a card mounted in the card slot.

3. The retainer device of claim 1 wherein the anchor mounted on the connectors is fabricated unitary with the connectors.

4. The retainer device of claim 3 wherein the anchor comprises at least one pair of anchor hooks, each of the hooks of the pair being located on opposite longitudinal sides of the connector.

5. The retainer device of claim 1 wherein the means to fasten the clip to the connector comprises an adhesive on the prongs.

6. The retainer device of claim 1 wherein the tie comprises a pair of straps, the straps having a loop at the connector ends engageable with the anchor.

7. The retainer device of claim 6 wherein the pair of straps have interconnector ends opposite the connector ends engageable with the anchor, one of the interconnector ends having a locking mechanism and the other one of the interconnector ends having a tongue with means for engaging the tongue with the locking mechanism and locking the interconnector ends of the strap together.

8. In a computer having connectors with card slots and replaceable computer cards mountable in the card slots of the connectors;

a retainer device for securing computer cards mounted in the slots of the connectors comprising:

an anchor mounted on the connectors; and, a tie extendable around a computer mounted in a card slot, the tie having connector ends engageable with the anchor to secure the card in the slot wherein the anchor comprises at least one pair of slotted tabs and the tie comprises a pair of monofilament strings, each with the connector end engageable with a respective slotted tab and each with an interconnectable interconnector end for interconnecting the strings around a card installed in a slot.

9. In a computer having connectors with card slots and replaceable computer cards mountable in the card slots of the connectors, the connectors having opposite longitudinal sides;

a retainer device for securing computer cards mounted in the slots of the connectors comprising:

at least one tie having a pair of tie elements, each tie element having a connector end and an interconnector end;

anchor means mounted on the connectors for engaging and retaining the connector ends of the tie elements on opposite longitudinal sides of the connectors; and, interconnection means at the interconnector ends of the tie elements for interconnecting the interconnector ends of the tie elements.

10. The retainer device of claim 9 wherein the interconnection means has adjustment means for adjusting the tension of the tie elements when the interconnector ends of the tie elements are interconnected by the interconnection means.

11. The retainer device of claim 9 wherein the tie elements comprise straps.

12. The retainer device of claim 9 wherein the tie elements comprise monofilament strings.

\* \* \* \* \*